United States Patent [19]
Caratsch

[11] 4,311,458
[45] Jan. 19, 1982

[54] TUNNEL FURNACE FOR FABRICATING PLATE-LIKE FLAT STRUCTURES, ESPECIALLY PRINTED CIRCUIT BOARDS COATED AT BOTH SIDES WITH A CURABLE MATERIAL

[76] Inventor: Hans-Peter Caratsch, Itenhardstrasse 16, 5620 Bremgarten, Switzerland

[21] Appl. No.: 164,188

[22] Filed: Jun. 30, 1980

[30] Foreign Application Priority Data

Jul. 19, 1979 [CH] Switzerland .................... 6727/79

[51] Int. Cl.³ .................. F27B 9/00; F26B 19/00
[52] U.S. Cl. ........................ 432/121; 34/216; 432/77; 432/144; 432/145
[58] Field of Search ............... 432/77, 121, 144, 145, 432/146, 152, 230, 235; 34/216, 217

[56] References Cited

U.S. PATENT DOCUMENTS

| | | | |
|---|---|---|---|
| 2,767,668 | 10/1956 | Spooner | 432/152 |
| 3,371,430 | 3/1968 | Bowman | 34/211 |
| 3,510,113 | 5/1970 | Wise | 432/230 |
| 3,640,049 | 2/1972 | Fritz et al. | 34/216 |
| 3,847,540 | 11/1974 | Farfaglia | 432/230 |
| 4,065,251 | 12/1977 | Croft et al. | 432/144 |

FOREIGN PATENT DOCUMENTS 1492092 11/1977 United Kingdom.

*Primary Examiner*—John J. Camby
*Attorney, Agent, or Firm*—Werner W. Kleeman

[57] ABSTRACT

Flat articles, in particular printed circuit boards, coated with a curable material, repose at their edges upon two belt conveyors which are positioned at an inclination. By means of these belt or band conveyors, the printed circuit boards are fed, in a predetermined conveying direction, below a heating device containing at least one hot air infeed device. The surface or face of the printed circuit board confronting such hot air infeed device is therefore subjected to the action of the hot or heated air, resulting in curing or hardening of the applied material layer. At the opposite side of the printed circuit board, facing away from the hot air infeed device, there is arranged a collecting tube or pipe which extends in the conveying direction. This collecting tube is provided with outlet openings for cooling air. Hence, the lower face of the printed circuit board has applied thereto the cooling air. In this way there is prevented that the layer of applied material which has already cured and located at the bottom face or side of the printed circuit board will again be exposed to thermal action, which undesirably could result in further undesired curing of such material layer.

10 Claims, 3 Drawing Figures

TUNNEL FURNACE FOR FABRICATING PLATE-LIKE FLAT STRUCTURES, ESPECIALLY PRINTED CIRCUIT BOARDS COATED AT BOTH SIDES WITH A CURABLE MATERIAL

BACKGROUND OF THE INVENTION

The present invention relates to a new and improved construction of tunnel furnace or kiln for fabricating plate-shaped flat structures, in particular printed circuit boards, coated at both sides or faces with a material which can be cured.

Generally speaking, the tunnel furnace of the present development, useful for the fabrication of plate-shaped flat articles or structures, especially printed circuit boards, which have been coated at both faces with a material which can be cured or hardened, is of the type comprising a conveyor device for the flat articles or structures and a heating device enclosing a hot air infeed device.

During the fabrication of printed circuit boards, it is known to apply to both sides of a base plate or substrate a curable material, for instance, an epoxy resin and to cure such within a furnace or kiln. This is accomplished by initially curing the material layer at the one side or face of the plate and thereafter the layer of material at the opposite side of such plate. The initially cured material layer therefore must pass twice through the heating furnace, and thus, during its second pass is again exposed to thermal action, causing a further curing of the applied material layer. Hence, this material layer tends to cure or harden much too intensely. This in turn renders more difficult, if not impossible, further processing such as photographic development of the coated plate or board or the like.

Now if, in order to avoid such phenomenon, the furnace temperature and the velocity of travel of the plates through the furnace are chosen such that the first material layer, passing twice through the furnace, during its first pass is only partially cured and then during its second pass cured to such an extent that a subsequent further processing of this material layer of the plate which has passed twice through the furnace is still possible, then the second material layer which is applied still remains tacky and possesses an irregular surface which is caused by solvent inclusions. If it is desired to also avoid this drawback, then the heating efficiency of the furnace and/or the throughpass velocity, during the second throughpass of the plates must be changed in relation to their first throughpass. This renders extremely difficult any continuous operation and also requires a correspondingly great expenditure in equipment and controls.

SUMMARY OF THE INVENTION

Therefore, it is a primary object of the present invention to provide a new and improved construction of tunnel furnace for the fabrication of plate-like flat articles, especially printed circuit boards, coated at both faces with a material which can be cured, which is not associated with the aforementioned drawbacks and limitations of the prior art constructions discussed above.

Another and more specific object of the present invention aims at overcoming the previously explained disadvantages of a tunnel furnace of the previously discussed constructions, wherein it is possible, without any great expenditure in equipment, to obtain a uniform production of plate-shaped flat articles or structures coated at both bases, with both coated faces possessing the desired degree of hardness.

Still a further significant object of the present invention aims at providing a new and improved construction of tunnel furnace for curing plate-shaped articles coated at both faces with a material which can be cured, which furnace is relatively simple in construction and design, economical to manufacture, extremely reliable in operation, not readily subject to breakdown or malfunction, requires a minimum of servicing and affords controlled curing or hardening of the coated faces of the plate-shaped articles.

Now in order to implement these and still further objects of the present invention, which will become more readily apparent as the description proceeds, the tunnel furnace of the present development is manifested by the features that at the side of the conveying path of the conveyor device, facing away from the heating device, there is provided a cooling air infeed device.

Hence, the flat structures or articles which migrate through the tunnel furnace are thus exposed at one side or face to the action of the hot or heated air, and at the opposite side or face to the action of the cooling air. Thus, there can be beneficially avoided that during the second pass of the flat structures or articles through the furnace, the material layer located at the first side of the flat structure, which was previously subjected during the first pass through the furnace to the action of the hot air infeed device for the purpose of curing such material layer, will be further cured or hardened. It has been surprisingly found that the introduction of cooling air into the interior of the furnace does not disturb the furnace atmosphere and, in particular, does not result in any impairment of the curing process of the material layer of the flat structure or article which confronts the hot air infeed device. Even if the flat structures or articles are individually introduced into the tunnel furnace and pass through the furnace at a mutual spacing from one another, there does not occur any mixing of the cooling air and heating air, since the heavier cooling air always drops back down towards the lower region of the furnace and forms a type of cushion upon which impacts the hot or heating air which then will be upwardly deflected. Hence, between the heating air and the cooling air there is a separation which essentially is located in the conveying plane of the flat structures or articles.

BRIEF DESCRIPTION OF THE DRAWINGS

The invention will be better understood and objects other than those set forth above will become apparent when consideration is given to the following detailed description thereof. Such description makes reference to the annexed drawings wherein.

Figure 1:
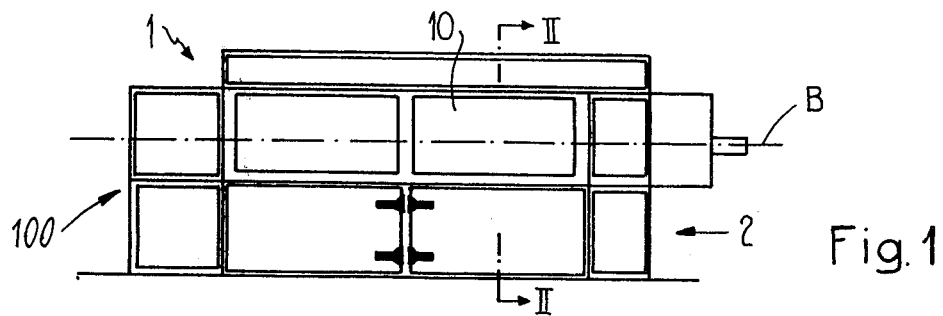
FIG. 1 is a schematic side view of a tunnel furnace or kiln constructed according to the invention.
Figure 2:
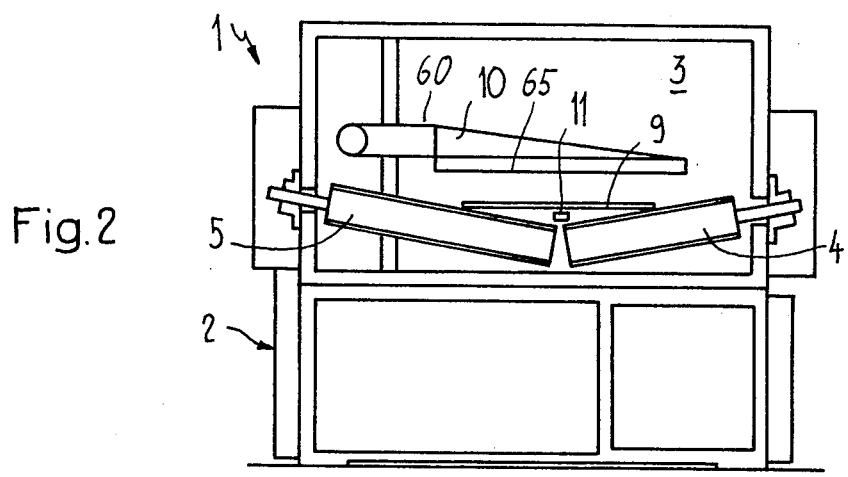
FIG. 2 is a sectional view, on an enlarged scale, of the tunnel furnace shown in FIG. 1, taken substantially along the line II—II thereof.

DETAILED DESCRIPTION OF THE PREFERRED EMBODIMENTS:

Describing now the drawings, there have been shown therein an exemplary embodiment of tunnel furnace 100 containing an upper portion or section 1, which is supported by means of a lower furnace portion or section 2 upon the ground. Within the upper furnace section there is located the furnace internal compartment or chamber 3 through which passes a conveyor device 50, extending in the conveying direction F of the plate-shaped, flat structures or articles 9, here assumed to be plates. This conveyor device 50 comprises two adjacently arranged band or belt conveyors 4, 5. Each of the belt conveyors 4, 5 assumes an inclined downwardly sloping position with respect to the other conveyor. Each of these belt or band conveyors 4, 5 possesses a conveyor band or belt 7 guided about two deflection rolls 6, 6'. As best seen by referring to FIG. 3, the one deflection roll 6' is driven by any suitable and therefore merely schematically illustrated drive or drive means 8. The conveying active run 7a of each conveyor belt 7 is therefore moved in the direction of the arrow F, which has been previously referred to as the conveying direction.

At the coating side of the tunnel surface or kiln, the plates or boards 9 which are to be processed, assumed here to be printed circuit boards by way of example, are placed upon the substantially V-shaped arranged belt conveyors 4, 5. As best seen by referring to FIGS. 3, the plates 9, owing to the inclined arrangement of the belt conveyors 4, 5, only bear by means of their edges 9' upon the conveyor belts 7.

A heating device or heating means 60 is arranged within the furnace chamber 3 above the belt or band conveyors 4, 5. The heating device 60 contains a hot air infeed device 10 which, in the illustrated exemplary embodiment, possesses a nozzle 65 serving to direct the hot or heated air downwardly against the plates 9 reposing upon the belt conveyors 4, 5. Apart from such hot air infeed device 10 the heating device or means 60 can be provided, for instance, with a conventional infrared radiating device.

At the side of the plates 9 passing through the furnace and facing away from the hot air infeeding device 10, there is arranged a cooling air device 70 containing a collecting tube or pipe 11 provided with outlet or exit nozzles 12. This collecting tube 11 is arranged between the belt conveyors 4 and 5 and located at the base of the space or region 80 between the belt conveyors 4 and 5 and which is of essentially V-shaped configuration in cross-section. This collecting tube or pipe 11 is connected with any suitable sources of cooling air, which has merely been schematically indicated in FIG. 3 by reference character 90.

The infeed of the cooling air to the collecting tube or pipe 11 can be accomplished from either of both sides of such tube or pipe 11 so that the cooling air either flows in the conveying direction F of the belt conveyors 4 and 5 or in counter current flow thereto through the collecting tube 11. By appropriate arrangement and/or construction of the nozzles 12 there can be attained the beneficial result that the infeed capacity of the nozzles 12 increases in the conveying direction F.

The plates 9, constituting support plates for the applied material, are coated with a curable material, for instance a special epoxy resin, and are passed by means of the belt conveyors 4 and 5 along the conveying path or path of travel B of FIG. 1 below the heating device 60, i.e. below the hot air infeed device 10. The top surface or face of the plates 9 confronting such hot air infeed device 10, is thus subjected to the action of the hot or heated air, resulting in curing (polymerization) of the material layer which has been applied to such top face of the plates 9. During a second pass of the plates 9 through the furnace, the other coated face or side of the plates 9 now face the hot air infeed device 10, whereas the cured material layer, which was hardened or cured during the first pass of the plates 9 through the furnace is located at the lower side or face of the plates 9. The lower side of the plates 9 are contacted by the cooling or cold air effluxing from the outlet nozzles 12, thereby preventing that the material layer which has already hardened and which is located at such lower face or side of the plates 9 will be once again subjected to the thermal action of the hot air infeed device 10. Thus, there is avoided a further curing of the material layers located at the lower or bottom face of the plates 9.

Figure 3:
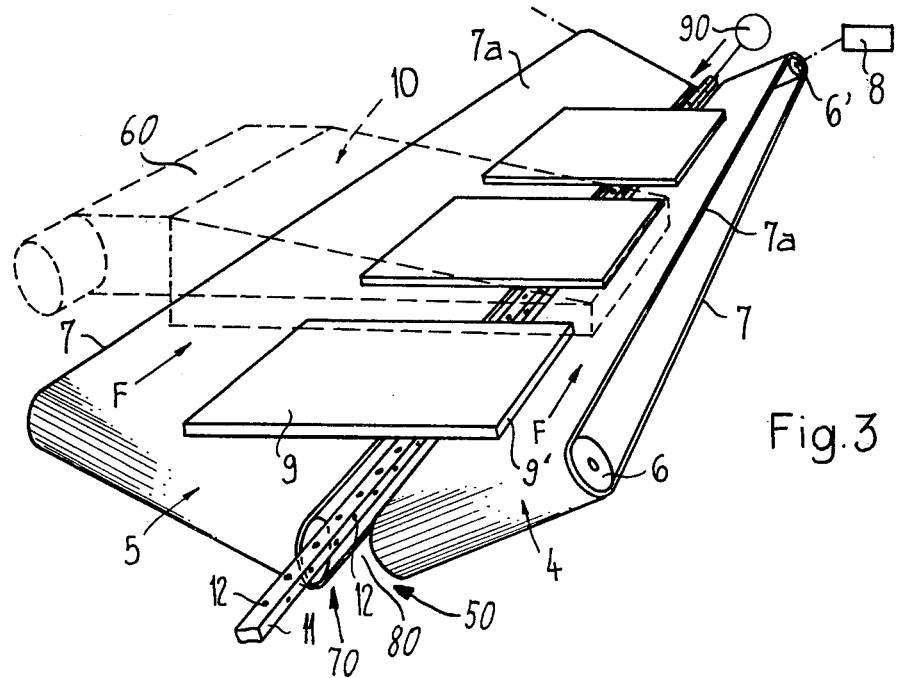
FIG. 3 is a perspective view of the conveyor device and the heating and cooling infeed devices.

An admixing of the cold air with the hot air cannot occur, although an intermediate space prevails between the individual plates 9, as the same has been shown in FIG. 3. The heavier cooling air always again drops downwardly within the furnace chamber or compartment 3, so that a cooling air cushion forms below the conveying path B. The hot air which effluxes out of the hot air infeed means or hot air infeed device 10 is again upwardly deflected by this cooling air cushion. Consequently, there prevails, approximately at the region of the conveying path B, a separation between the cooling air and the heating or hot air.

This hot air is sucked-off out of the furnace compartment or chamber 3, for instance through the use of any standard ventilator or equivalent structure, conducted through a suitable air heater and is then again blown back into the furnace chamber 3. The cooling air is likewise withdrawn from the furnace chamber 3, and if desired, again appropriately prepared, i.e. cooled for reuse.

It should be understood that both the hot air infeed device 10 and equally the cooling air infeed device 70 can be differently constructed than disclosed herein by way of example and not limitation. Instead of using a collecting tube or pipe 11, equipped with the exit or outlet nozzles 12, there also can be provided individual nozzles which are in flow communication with a common supply line for the cooling air. Although there have been used for the conveyor device 50, as illustrated, preferably band or belt conveyors 4 and 5, it is also possible to use a different type of conveyor structure, for instance roller conveyors which likewise are arranged in a substantially V-shaped configuration.

While there are shown and described present preferred embodiments of the invention, it is to be distinctly understood that the invention is not limited thereto, but may be otherwise variously embodied and practiced within the scope of the following claims. Accordingly

What I claim is:

1. A tunnel furnace for the heat treatment of plate-shaped, substantially flat articles, in particular printed circuit boards, coated at both faces with a curable material, comprising:

a treatment chamber;

conveyor means passing through said treatment chamber for conveying the flat articles with both coated faces of the flat articles being simultaneously exposed in a predetermined conveying direction along a conveying path;

heating means arranged within said chamber and containing a hot air infeed device for applying hot air to the face of the flat articles, said hot air infeed device being arranged at one side of the conveying path of the flat articles; and a cooling air infeed device arranged within said treatment chamber and at the other side of the conveying path of the flat articles which faces away from said hot air infeed device, said cooling air infeed device applying cooling air to the other side of said flat articles.

2. The tunnel furnace as defined in claim 1, wherein:
said cooling air infeed device is arranged below said hot air infeed device.

3. The tunnel furnace as defined in claim 2, wherein:
said conveyor means comprises two adjacently arranged belt conveyors;
each of said belt conveyors assuming a descending inclined position with respect to the other belt conveyor; and
said cooling air infeed device being arranged between both of said belt conveyors.

4. The tunnel furnace as defined in claim 2, wherein:
said conveyor means comprises two adjacently arranged roller conveyors;
each of said roller conveyors possessing a descending inclined position with respect to the other roller conveyor; and
said cooling air infeed device being arranged between both of said roller conveyors.

5. The tunnel furnace as defined in claim 1, wherein:
said conveyor means comprises two adjacently arranged belt conveyors;
each of said belt conveyors assuming a descending inclined position with respect to the other belt conveyor; and
said cooling air infeed device being arranged between both of said belt conveyors.

6. The tunnel furnace as defined in claim 1, wherein:
said conveyor means comprises two adjacently arranged roller conveyors;
each of said roller conveyors possessing a descending inclined position with respect to the other roller conveyor; and
said cooling air infeed device being arranged between both of said roller conveyors.

7. The tunnel furnace as defined in claim 1, wherein:
said cooling air infeed device comprises at least one row of nozzle means extending essentially parallel to said conveying path.

8. The tunnel furnace as defined in claim 7, further including:
a common cooling air supply means provided for said nozzle means.

9. The tunnel furnace as defined in claim 8, wherein:
the air in said common supply means is infed to said nozzle means in counter-current to the conveying direction of the flat articles.

10. The tunnel furnace as defined in claim 1, wherein:
said cooling air infeed device comprises a collecting tube provided with air outlet openings.

* * * * *